(12) United States Patent
Faria et al.

(10) Patent No.: US 6,295,215 B1
(45) Date of Patent: Sep. 25, 2001

(54) AC POWER SUPPLY APPARATUS WITH ECONOMY MODE AND METHODS OF OPERATION THEREOF

(75) Inventors: Des Faria; Hong Zhang; Piotr Grudzinski; Edward Akbari, all of Ontario (CA); Ove Ohman, Espoo (FI)

(73) Assignee: Powerware Corporation, Raleigh, NC (US)

(*) Notice: Subject to any disclaimer, the term of this patent is extended or adjusted under 35 U.S.C. 154(b) by 0 days.

(21) Appl. No.: 09/545,201

(22) Filed: Apr. 6, 2000

(51) Int. Cl.[7] ............................................. H02M 5/458
(52) U.S. Cl. .............................. 363/37; 363/34; 363/124
(58) Field of Search .............................. 363/34, 37, 124, 363/131, 132

(56) References Cited

U.S. PATENT DOCUMENTS

| | | | |
|---|---|---|---|
| 4,456,872 | 6/1984 | Froeschle | 323/286 |
| 5,126,585 | 6/1992 | Boys | 307/66 |
| 5,289,045 | 2/1994 | Lavin et al. | 307/64 |
| 5,345,165 | 9/1994 | Froeschle | 323/284 |
| 5,384,792 | 1/1995 | Hirachi | 371/66 |
| 5,612,580 | 3/1997 | Janonis et al. | 307/64 |
| 5,633,789 * | 5/1997 | Kimura et al. | 363/50 |
| 5,638,244 | 6/1997 | Mekanik et al. | 361/62 |
| 5,642,002 | 6/1997 | Mekanik et al. | 307/64 |
| 5,737,209 | 4/1998 | Stevens | 363/143 |
| 5,745,356 | 4/1998 | Tassitino, Jr. et al. | 363/71 |
| 5,747,887 | 5/1998 | Takanaga et al. | 307/64 |
| 5,764,496 * | 6/1998 | Sato et al. | 363/37 |
| 5,777,866 | 7/1998 | Jacobs et al. | 363/126 |
| 5,867,377 | 2/1999 | Suranyi | 363/60 |
| 5,949,662 | 9/1999 | Boldin et al. | 363/37 |
| 5,978,236 | 11/1999 | Faberman et al. | 363/37 |
| 6,052,292 * | 4/2000 | Podlesak | 363/34 |

OTHER PUBLICATIONS

Rathman, Soren, "New Generation UPS Technology, The Delta Conversion Principle," Conference Record—IAS Annual Meeting (IEEE Industry Applications Society) v. 4, 1996, IEEE, Piscataway, NJ, pp 2389–2395.

Marshall, G., "Uninterruptible Power Supplies, Gear Up to Purge the Surges" Network Week, vol. 3, No. 43, Aug. 5, 1998, pp. 25–27.

Ho et al., "A New Single–Phase On–Line UPS Structure Pre–staged with PFC–and–Boost Converter," 1997 International Conference on Power Electronics and Drives Systems Proceedings, vol. 1, 1997, pp. 133–138.

(List continued on next page.)

*Primary Examiner*—Adolf Deneke Berhane
(74) *Attorney, Agent, or Firm*—Myers Bigel Sibley & Sajovec

(57) ABSTRACT

A power supply apparatus includes an AC input port, an output port, and a bypass circuit that couples the AC input port to the output port. An AC/DC converter circuit, e.g., a rectifier circuit, produces a DC voltage from an AC input voltage at the AC input port. A DC/AC converter circuit, e.g., a current mode controlled inverter, controls current transfer between the output port and the AC/DC converter circuit responsive to a control input such that respective first and second component currents of a current delivered to a load coupled to the output port pass via respective ones of the bypass circuit and the DC/AC converter circuit. The DC/AC converter circuit may be operated such that current passing through the bypass circuit is constrained to be substantially in phase with the AC input voltage. The power supply apparatus may have another mode of operation in which the DC/AC converter circuit exclusively provides power to the output port, and may include an auxiliary DC power supply circuit that provides a DC voltage to the DC/AC converter circuit. Related power supply methods are also discussed.

45 Claims, 8 Drawing Sheets

OTHER PUBLICATIONS

Chen, Yie–Tone, "Power Factor Correction of a Single–Phase On–Line UPS with the Half–Bridge Inverter," Proceedings of the 1996 IEEE IECON. $22^{nd}$ International Conference on Industrial Electronics, Control and Instrumentation, vol. 3, 1996, pp. 1826–2831.

Kamran, Farrukh, "A Novel On–Line UPS with Universal Filtering Capabilities," IEEE Transactions on Power Electronics, vol. 13, No. 3, May 1998, pp. 410–418.

Krishnan, R., "Design and Development of a High Frequency On–Line Uninterruptible Power Supply," Proceedings of the 1995 IEEE IECON $21^{st}$ International Conference on Industrial Electronics, Control, and Instrumentation, vol. 1 of 2, Plenary Session, Invited Sessions, and Power Electronics, pp. 578–583.

Levy, Aron, "Online UPSs Save 'Mission–Critical' Applications", Electronics Design, Sep. 1, 1998, pp. 109–117.

MacCleary, Randy, "On–Line or 'On–Line', The Truth about UPS topologies," Telephony, Oct. 5, 1998, pp. PTN12–PTN–14.

Raddi et al., "A Utility Interactive PWM Sine–Wave Inverter Configured as a High Efficiency UPS," IEEE, 1982, pp. 42–48.

* cited by examiner

AC POWER SUPPLY APPARATUS WITH ECONOMY MODE AND METHODS OF OPERATION THEREOF

BACKGROUND OF THE INVENTION

The present invention relates to power supply apparatus and methods of operation thereof, and more particular, to AC power supply apparatus and methods.

Power supply circuits are commonly used in equipment such as uninterrupted (or "uninterruptible") power supplies (UPSs), motor drives, and other applications. Conventional UPSs use a variety of different circuit topologies, including standby, line-interactive and on-line topologies. Generally, each of these topologies has advantages and disadvantages and, accordingly, selection of a particular topology is typically governed by the needs of the application.

For example, a typical standby UPS topology includes a transfer switch that directly connects the load to a primary AC power source under normal conditions and that transfers the load to a secondary AC source derived from a battery or other auxiliary source when the primary AC power source fails. Due to the time needed to operate the transfer switch, such a standby UPS often exhibit a significant interruption in power delivered to the load, which may be unacceptable for data processing or other critical tasks. In addition, standby UPSs often do not compensate for power quality, e.g., voltage degradation, harmonic distortion and low power factor. Nonetheless, the standby topology is often used for low-cost UPSs, as it is often cheaper to produce than other topologies. A line interactive UPS may use a transfer switch arrangement similar to that of the standby topology, but may also include means for regulating and conditioning the AC power source to improve power quality.

Many UPSs use an online topology. For example, a typical online series train UPS includes a series train AC/AC converter that produces an AC output voltage at a load from an AC input voltage provided by an AC power source such as a utility, but includes a DC link that is used to isolate the load from disturbance and other degradation of the AC power source. The intermediate DC bus is typically coupled to an inverter that inverts the DC voltage on the DC bus to produce an AC output. Other circuits, such as filters and regulators, may be included in the path with the rectifier and the inverter. Typically, the DC bus is also coupled to an auxiliary source of power, such as a battery, which maintains the DC voltage on the DC bus in the event the AC power source fails. Some online UPSs use circuit topologies other than a series train, including more complex topologies, such as delta converters, or other techniques.

Under normal operating conditions, online UPS's supply power to a load through a rectifier/inverter chain or similar regulating circuitry, providing relatively clean and regulated power at the output of the UPS. When the AC power source fails, the UPS may achieve an uninterrupted transition to battery power, as there typically is no need to change the state of a transfer switch. Some online series train UPSs also include a bypass feature such that, in the event of a failure, the inverter is prevented from supplying power to the load (e.g., by disconnecting it from the load or placing it into an inactive standby state) while the load is connected to the AC power source via a bypass path. Such a feature may also be used to provide an "economy" mode of operation, as power dissipation associated with the operation of the rectifier/inverter chain may be reduced when the load is transferred to the bypass path.

However, such an approach may be compromised if the AC power source is subject to small but frequent excursions outside of the power quality criteria, as may be the case, for example, in systems powered by an unsteady AC power source, Such as an auxiliary generator set. In such a case, the UPS may be forced to power the load through the inverter in order to meet the power quality requirements of the load, thus reducing the opportunity for greater efficiency through bypass operation.

SUMMARY OF THE INVENTION

According to embodiments of the invention, improved efficiency may be achieved in a power supply apparatus (e.g., a UPS circuit) that incorporates an AC/DC converter that produces an intermediate DC voltage from an AC input voltage. The power supply apparatus includes a multi-mode DC/AC converter circuit that provides a first component of power, for example, a real power component, while a bypass circuit provides a second component of power, for example, a harmonic power component and/or a reactive power component, to the load from an AC power source. The DC/AC converter circuit may include a current mode controlled inverter that provides reactive and harmonic currents to the load such that the bypass circuit predominantly transfers real power between the AC source and the load. In this manner, power factor and other power quality parameters at the AC source may be maintained at desired levels.

In particular, in embodiments of the invention, a power supply apparatus includes an AC input port, an output port, and a bypass circuit that couples the AC input port to the output port. An AC/DC converter circuit, coupled to the AC input port, produces a DC voltage from an AC input voltage at the AC input port. A DC/AC converter circuit, coupled to the AC/DC converter circuit, controls current transfer between the output port and the AC/DC converter circuit responsive to a control input such that respective first and second component currents of a current delivered to a load coupled to the output port pass via respective ones of the bypass circuit and the DC/AC converter circuit. The DC/AC converter circuit may be operated such that current passing through the bypass circuit is constrained to be substantially in phase with the AC input voltage.

In other embodiments of the invention, a power supply apparatus includes an AC input port, first and second voltage busses, and an output port. An AC/DC converter circuit, coupled to the AC output port and to the first and second voltage busses, produces a DC voltage across the first and second voltage busses from an AC input voltage at the AC input port. A first switching circuit selectively couples the AC input port and the output port responsive to a first control input. A second switching circuit selectively couples the output port and the first and second voltage busses responsive to a second control input. A control circuit generates the first and second control inputs such that, in a first mode of operation, the first switching circuit decouples the AC input port from the output port while the second switching circuit supplies power to the output port. In a second mode of operation, the first switching circuit couples the AC input port to the output port and supplies a first component of a power at the output port while the second switching circuit supplies a second component of the power at the output port. In the second mode of operation, the control circuit may generate the second control input such that the current passing through the first switching circuit is substantially in phase with the AC input voltage.

In yet other embodiments of the invention, an uninterruptible power supply (UPS) apparatus includes an AC input port, an AC output port, and a bypass circuit that couples and decouples the AC input port to and from the AC output port responsive to a first control input. A series train AC/AC conversion circuit, coupled to the AC input port and to the AC output port, transfers power between the AC input port and the AC output port such that, in a first mode of operation, the series train AC/AC conversion circuit transfers a first component of power from the AC input port to the AC output port while the bypass circuit transfers a second component of power from the AC input port to the AC output port. In a second mode of operation, the series train AC/AC conversion circuit transfers power from the AC input port to the AC output port while the bypass circuit decouples the AC input port from the AC output port. In the first mode of operation, the series train AC/AC conversion circuit may be operated such that it causes the bypass circuit to predominantly transfer real power from the AC input port to the AC output port. The series train AC/AC conversion circuit may include an AC/DC converter circuit, such as a rectifier circuit, that produces a DC voltage from an AC voltage at the AC input port, and a DC/AC converter circuit, such as an inverter circuit, that controls current transfer between the AC/DC converter circuit and the AC output port. The series train AC/DC converter circuit may also include an auxiliary DC input port that provides DC power to the DC/AC converter circuit.

According to still other embodiments of the invention, a UPS apparatus includes an AC input port, an AC output port, and a bypass circuit that couples and decouples the AC input port to and from the AC output port responsive to a first control input. A rectifier circuit, coupled to the AC input port, produces a DC voltage at a rectifier circuit output from an AC input voltage at the AC input port. An inverter circuit, coupled to the rectifier circuit output and to the AC output port, transfers power between the rectifier circuit and the AC output port such that, in a first mode of operation, the inverter circuit transfers a first component of power to the AC output port while the bypass circuit transfers a second component of power to the AC output port. In a second mode of operation, the inverter circuit transfers power to the AC output port while the bypass circuit decouples the AC input port from the AC output port. In the first mode of operation, the inverter circuit may be operated such that it causes the bypass circuit to predominantly transfer real power from the AC input port to the AC output port. The UPS apparatus may further include an auxiliary DC power source that provides a DC voltage to the inverter circuit.

According to method embodiments of the invention, AC power is provided to a load. An AC power source is coupled to the load through a bypass path. The AC power source is also coupled to an intermediate bus such that a DC voltage is generated at the intermediate bus. Current transfer between the intermediate bus and the load is controlled such that respective first and second component currents of a current delivered to the load pass via respective ones of the bypass path and the intermediate bus. Current transfer between the intermediate bus and the load may be controlled such that predominantly real power is delivered to the load via the bypass path, and such that predominantly non-real power components are delivered to the load via the intermediate bus.

The apparatus and methods of the present invention may provide improved ways for providing AC power to a load. For example, in a UPS application according to embodiments of the invention, improved efficiency may be provided by operating a series train UPS in an economy mode wherein a bypass circuit provides real power and the series train provides reactive and harmonic power. This may provide more power quality and security than offered by conventional bypass modes. It will be appreciated that the invention is applicable to a variety of single and polyphase AC applications.

DETAILED DESCRIPTION

Figure 1:
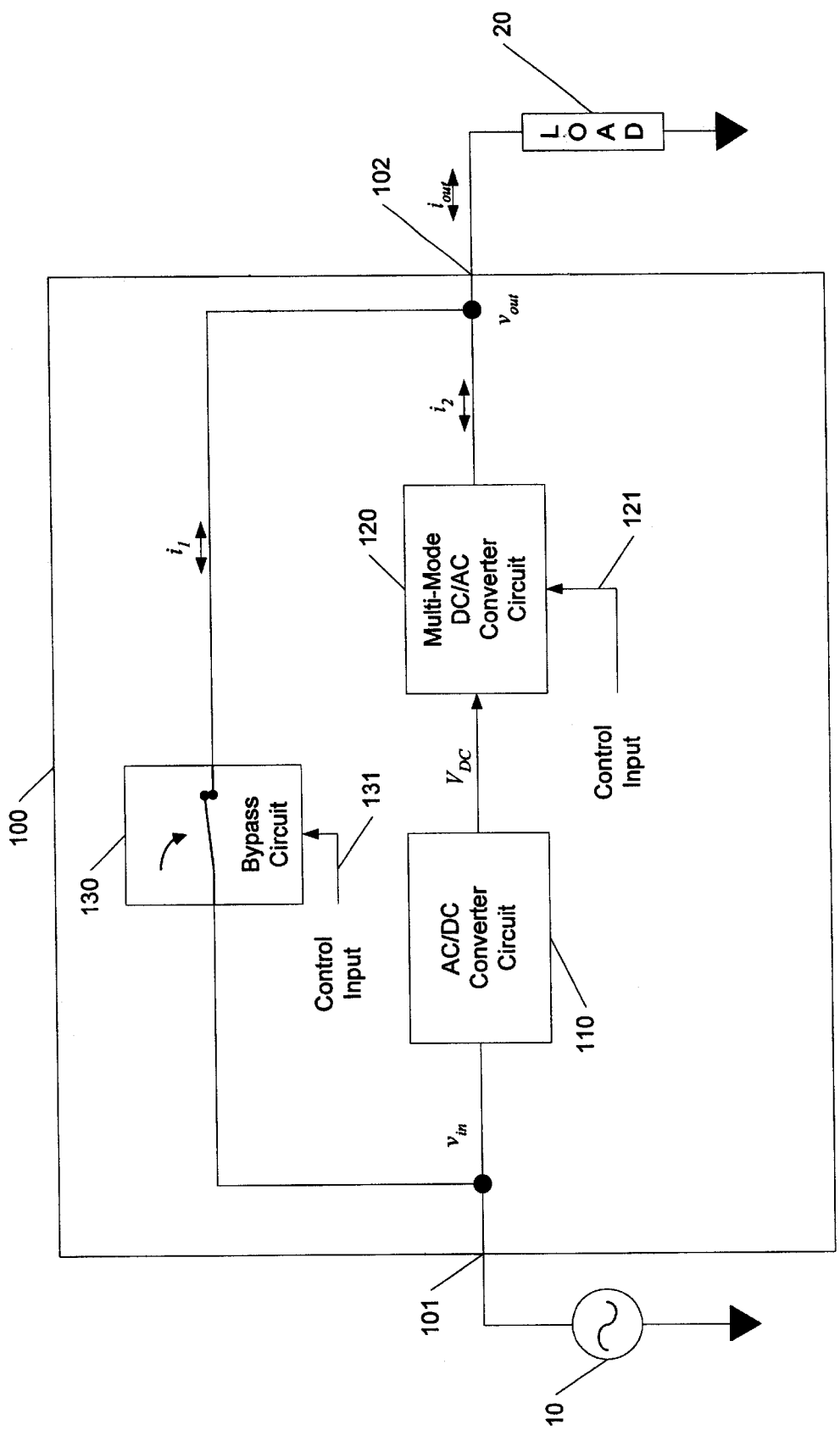
FIG. 1 is a schematic diagram illustrating a power supply apparatus according to embodiments of the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements.

FIG. 1 illustrates a power supply apparatus 100 according to embodiments of the present invention. The power supply apparatus 100 includes an AC/DC converter circuit 110, such as rectifier circuit, that produces a DC voltage $V_{DC}$ from an AC input voltage $v_{in}$, produced by an AC power source 10 coupled to an AC input port 101 of the power supply apparatus 100. The power supply apparatus 100 also includes a bypass circuit 130 that is operative to couple and decouple the AC input port 101 to an output port 102 of the power supply apparatus 100 responsive to a first control input 131. The power supply apparatus 100 further includes a multi-mode DC/AC converter circuit 120 that, in a first mode in cooperation with bypass circuit 130, controls current transfer between the AC/DC converter circuit 110 and the output port 102 responsive to a control input 121 such that respective first and second component currents $i_1$, $i_2$ of a current $i_{out}$ delivered to a load 20 coupled to the output port 102 are supplied by respective ones of the bypass circuit 130 and the multi-mode DC/AC converter circuit 120 when the AC input port 101 and the output port 102 are coupled by the bypass circuit 130. As described in greater detail below, when operating in this mode, the multi-mode DC/AC converter circuit 120 preferably controls the current $i_2$ such that the bypass circuit 130 predominantly delivers real power to the load 20 while the multi-mode DC/AC converter circuit 120 predominantly supplies reactive and harmonic power components associated with the load 20, thus generally acting as a tracking line filter. In a second mode, the AC input port 101 is decoupled from the output port 102 by the bypass circuit 130, and the current $i_{out}$ is preferably supplied substantially solely by the multi-mode DC/AC converter circuit 120, operating in an on-line series train fashion.

The AC/DC converter circuit 110 may comprise any of a number of different circuits that are operative to produce a DC voltage from an AC input voltage, such as passive and active rectifier circuits. The multi-mode AC/DC converter circuit 120 may comprise any of a number of different types of circuits capable of controlling current flow between the AC/DC converter circuit 110 and the output port 102, such as current mode controlled inverter circuits. The bypass circuit 130 may comprise any of a number of switching circuits, such as those employing solid state or mechanical relays, insulated gate bipolar transistors (IGBTs), and silicon control rectifiers (SCRs). As described below, the bypass circuit 130 preferably employs an antiparallel (back to back) SCR configuration that is controlled such that a relatively seamless transition between modes of operation of the power supply apparatus can be achieved.

Figure 2:
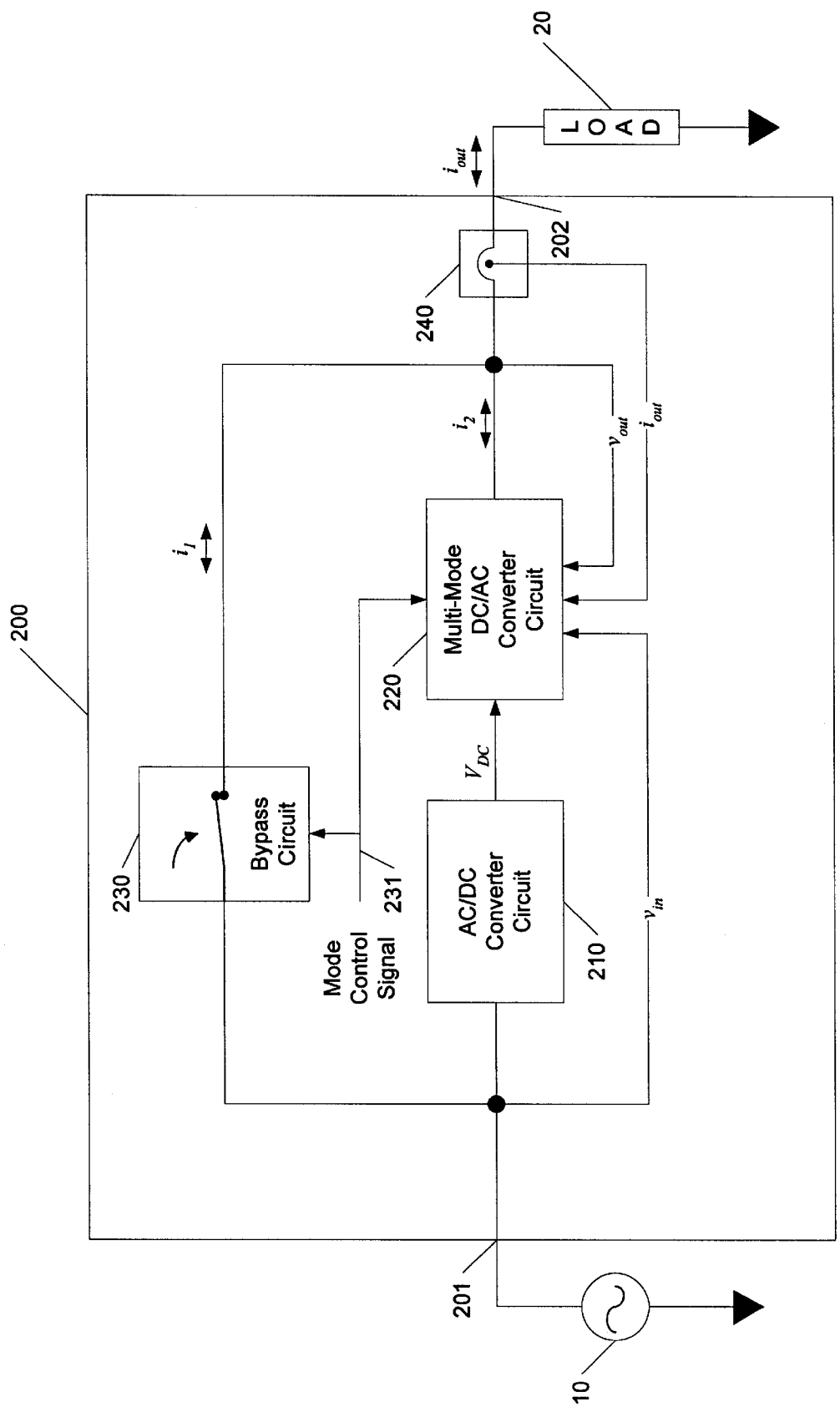
FIG. 2 is a schematic diagram illustrating a power supply apparatus according to other embodiments of the invention.

FIG. 2 illustrates a power supply apparatus 200 according to other embodiments of the invention. The power supply apparatus 200 includes an AC/DC converter circuit 210 that produces a DC voltage $V_{DC}$ from an AC input voltage $v_{in}$ and a bypass circuit 230 that couples and decouples an AC input port 201 from an output port 202 responsive to a mode control signal 231. The power supply apparatus 200 also includes a multi-mode DC/AC converter circuit 220 that controls a current $i_2$ passing between the output port 202 and the AC/DC converter circuit 210 responsive to an output current $i_{out}$ passing between the output port 202 and a load 20 sensed by a current sensor 240, an output voltage $v_{out}$ at the output port 202, and the AC input voltage $v_{in}$.

The multi-mode DC/AC converter circuit 220 is also operative to transition between first and second operating modes responsive to the mode control signal 231. In a first mode, the multi-mode DC/AC converter circuit 220 and the bypass circuit 230 operate such that respective first and second component currents $i_1$, $i_2$ of the output current $i_{out}$ are supplied via respective ones of the multi-mode DC/AC converter circuit 220 and the bypass circuit 230. In a second mode, the multi-mode DC/AC converter circuit 220 and the bypass circuit 230 preferably operate such that the load 20 is exclusively supplied via the multi-mode DC/AC converter circuit 220.

In either of the first and second modes, the multi-mode DC/AC converter circuit 220 preferably determines a differential power demand at the output port 202 responsive to a sensed output current $i_{out}$, a sensed output voltage signal $v_{out}$ and a sensed input voltage signal $v_{in}$ determines a level for the current $i_2$ that supports the determined power demand and controls the current $i_2$ to provide the determined level. In the second mode, the multi-mode DC/AC converter circuit 220 determines a total power demand and, preferably, determines a level for the current $i_2$ that meets this total power demand. In the first mode the multi-mode DC/AC converter circuit 220 preferably determines a level for the current $i_2$ that meets a non-real component of the total power demand at the output port 202, i.e., a component associated with harmonic and reactive currents needed to support the total power demand at the output port 202, while the bypass circuit 230 supplies real power to the output port 202, i.e., such that the component current $i_1$ is substantially in phase with the AC input voltage $v_{in}$.

Figure 3:
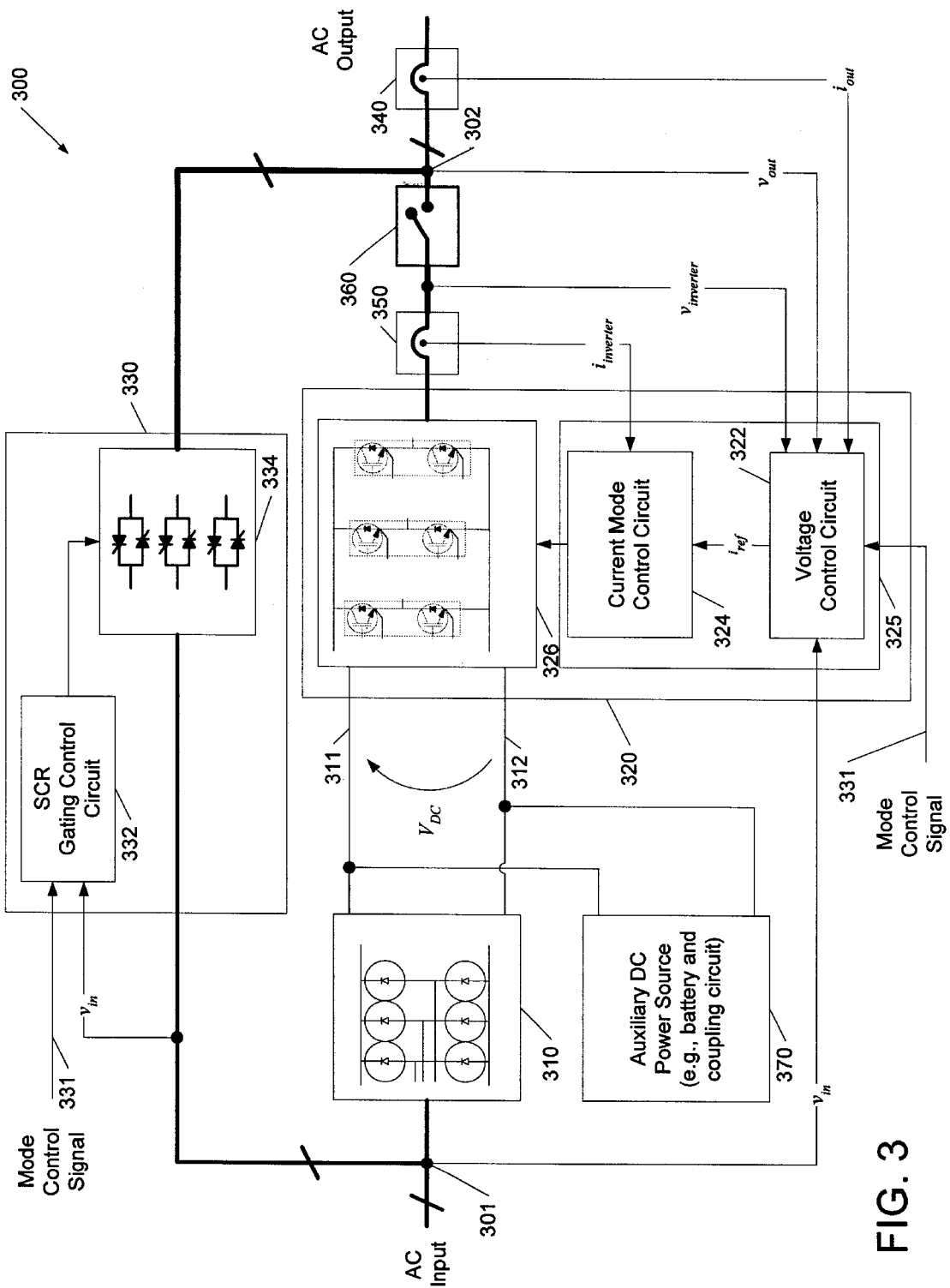
FIG. 3 is a schematic diagram illustrating a three-phase power supply apparatus according to embodiments of the invention.

FIG. 3 illustrates an exemplary three-phase power supply apparatus 300 according to yet other embodiments of the invention, in particular, a power supply apparatus configured for use in a UPS. The power supply apparatus 300 includes an AC input port 301 that is coupled to an input of an AC/DC converter circuit 310, here shown as a three-phase passive rectifier circuit. The AC/DC converter circuit 310 produces a DC voltage $V_{DC}$ across first and second voltage busses 311, 312. The AC input port 301 is also coupled to a bypass circuit 330, here shown as including a three-phase array 334 of antiparallel-connected SCRs controlled by an SCR gating control circuit 332 responsive to a mode control signal 331 and the AC input voltage $v_{in}$. An auxiliary DC power source 370 is coupled to the first and second voltage busses 311, 312 such that an alternative means for maintaining the DC voltage $V_{DC}$ is provided in the event, for example, that an AC source coupled to the AC input port 301 fails.

The power supply apparatus 300 also includes a multi-mode DC/AC converter circuit 320 that controls current flow between the first and second voltage busses 311, 312 and an output port 302. As shown, the multi-mode DC/AC converter circuit 320 includes a switching circuit 326 configured in a three-phase inverter configuration, controlled by a control circuit 325 and switchably coupled to the output port 302 by a switch 360. The control circuit 325 includes a current mode control circuit 324 that controls the switching circuit 326 responsive to a reference current signal $i_{ref}$ (current command) and a sense inverter current signal $i_{inverter}$ generated by a first current sensor 350. The control circuit 325 also includes a voltage control circuit 322 that generates the reference current signal $i_{ref}$ responsive to a sensed output voltage signal $v_{out}$ at the output port 302, a sensed output voltage signal $v_{inverter}$ produced by the switching circuit 326, the sensed AC input voltage signal $v_{in}$, and a sensed output current signal $i_{out}$ generated by a second current sensor 340.

The reference current $i_{ref}$ is generated by the voltage control circuit 322 depending on the mode control signal 321. In a first, "economy" mode, the voltage control circuit 322 generates the reference current signal $i_{ref}$ such that respective first and second power components are delivered to the output port 302 by respective ones of the bypass circuit 330 and the switching circuit 326, preferably such that the bypass circuit 330 predominantly delivers real power to the output port 302 while the switching circuit 326 delivers predominantly reactive and harmonic power components. In a second, "normal" mode, the bypass circuit 330 decouples the input port 301 from the output port 302, and the voltage control circuit 322 produces the reference current $i_{ref}$ such that the total power demand at the output port 302 is served by the switching circuit 326.

In normal mode, i.e., when the switch 360 is closed and the bypass circuit 330 is open, the DC/AC converter circuit 320 supplies power to the load. To initiate transition to the economy mode, the voltage control circuit 322 first matches the phase and amplitude of the inverter output voltage $v_{inverter}$ to the AC input voltage $v_{in}$, and then the SCR gating control circuit 332 commences gating of the SCRs of the bypass circuit 330. The voltage control circuit 322 determines a real current demand at the output port 302 responsive to the sensed output voltage signal $v_{out}$ and the output current signal $i_{out}$, and produces the reference current signal $i_{ref}$ based on this determined current demand and synchronized with the AC input voltage signal $v_{in}$. To transition back to normal mode, the SCR gating control circuit 332 ceases gating the SCRs, thus decoupling the input port 301 from the output port 302.

The SCR gating control circuit 332 may be operated such that a substantially seamless transition between the two operating modes can be achieved under conditions that might otherwise cause a significant disruption of the voltage $v_{out}$ produced at the output port 302. Preferably, the SCRs are gated such that each SCR receives a gate pulse only when its anode is positive with respect to its cathode. For example, when the SCR gating circuit 332 is operated in such a manner, if the AC input port 302 is shorted to ground during a half-cycle of the AC input voltage $v_{in}$ when operating in economy mode, conduction between the output port 302 and the AC input port 301 can be avoided because the currently conducting SCR of each antiparallel connected pair will automatically turn off and the other SCR of the pair will remain inactive. Accordingly, the power supply apparatus 300 can transition the load 20 to the DC/AC converter circuit 320 with reduced disruption at the output port 302.

It will be appreciated that the multi-mode DC/AC converter circuit 320 is offered for exemplary purposes, and that, in general, any of a number of other circuit configurations may be used with the invention. For example, additional regulation components may be included in the path of the AC/DC converter 310 and the DC/AC converter 320, such as DC voltage regulators and neutral regulators. It will also be appreciated that any of number of different circuits capable of controlling current flow between the first and second voltage busses 311, 312 and the output port 302 may be used with the invention. The current mode control circuit 324 may comprise any of a number of different controller designs, and preferably has bandwidth sufficient to allow the DC/AC converter circuit 320 to modulate the inverter current $i_{inverter}$ at frequencies that are multiples of the fundamental frequency of the AC input voltage $v_{in}$. The power control circuit 322 may also take any of a number of different control configurations. It will be appreciated that, in general, the current mode control circuit 324 and the voltage control circuit 324 may be implemented using analog and/or digital control circuits, and may be implemented in special purpose hardware, as software or firmware executing on a general or special purpose computing device, or as combinations thereof.

Figure 4:
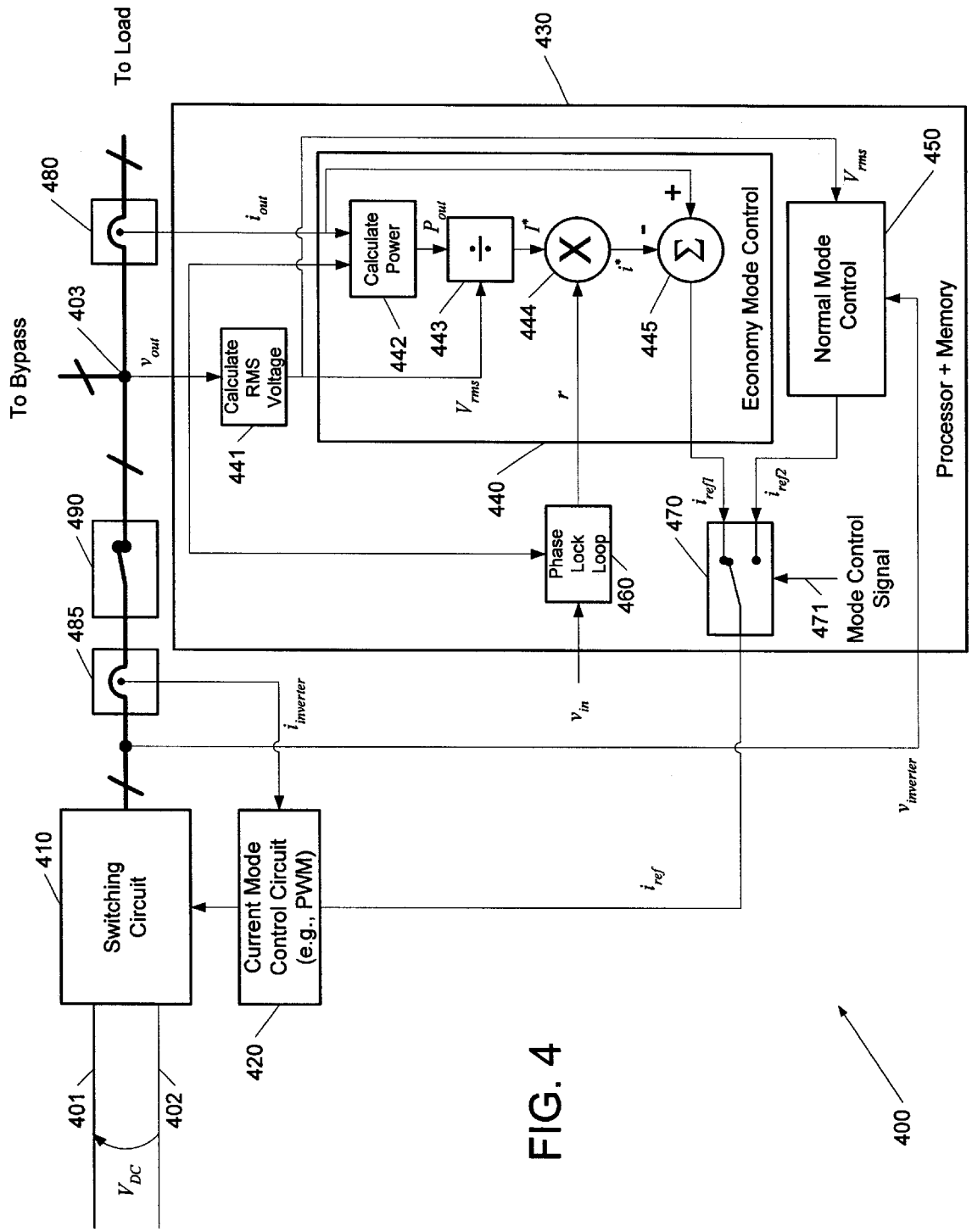
FIGS. 4 and 5 are schematic diagrams illustrating a multi-mode DC/AC converter circuit according to embodiments of the invention.

FIG. 4 illustrates an exemplary multi-mode DC/AC converter circuit 400 according to embodiments of the invention. The DC/AC converter circuit 400 includes a hardware current mode control circuit 420 that operates a switching circuit 410 as a current controlled inverter. The switching circuit 410 is switchably coupled by a switch 490 to an output port 403 to which a load and a bypass circuit may be connected. The current mode control circuit 420 controls the current between the first and second voltage busses 401, 402 (across which a DC voltage $V_{DC}$ is maintained) and the output port 403 responsive to a reference current signal $i_{ref}$ generated by a voltage control circuit 430 and to an inverter current signal $i_{inverter}$ generated by a current sensor 485.

The voltage control circuit 430 is here shown as including a plurality of modules executing on a combination of a data processor (e.g., a microprocessor, digital signal processor (DSP), or combination thereof) and an associated memory. The modules include an RMS voltage calculation module 441 that computes an RMS voltage $V_{rms}$ from an output voltage signal $v_{out}$ sensed at the output port 403, an economy mode control module 440 that generates a first reference current signal $i_{ref1}$, a normal mode control module 450 that generates a second reference current signal $i_{ref2}$, and a selector module 470 that applies one of the first and second reference current signals $i_{ref1}$, $i_{ref2}$ to the current mode control circuit 420 responsive to a mode control signal 471.

The economy mode control module 440 includes a power calculation module 442 that calculates the power $P_{out}$ responsive to the sensed output voltage signal $v_{out}$ and to a sensed output current signal $i_{out}$ generated by a second current sensor 480. A divider module 443 divides the calculated power $P_{out}$ by the calculated RMS voltage $V_{rms}$, producing a calculated current magnitude $I^*$ that represents an estimate of the magnitude of a real current component (i.e., a current substantially in phase with the AC input voltage $v_{in}$) of the output current signal $i_{out}$. The computed current magnitude $I^*$ is modulated at a multiplier module 444 by a reference signal r generated by a phase lock loop 460 from the output voltage signal $v_{out}$ and the AC input voltage signal $v_{in}$. The resulting current signal $i^*$ represents a desired current to be provided to the output port via the bypass circuit (not shown) such that current carried by the bypass circuit is substantially in phase with the AC input voltage signal $v_{in}$ and the bypass circuit predominantly delivers the real power demand at the output port 403. The current signal $i^*$ is subtracted from the sensed output current signal $i^{out}$ at a summing module 445 to determine the first reference current signal $i_{ref1}$. In an economy mode commanded by a mode control signal 471, the first reference current signal $i_{ref1}$ is selected by the selector module 470 as the reference current signal $i_{ref}$ for the current mode control circuit 420.

Figure 5:
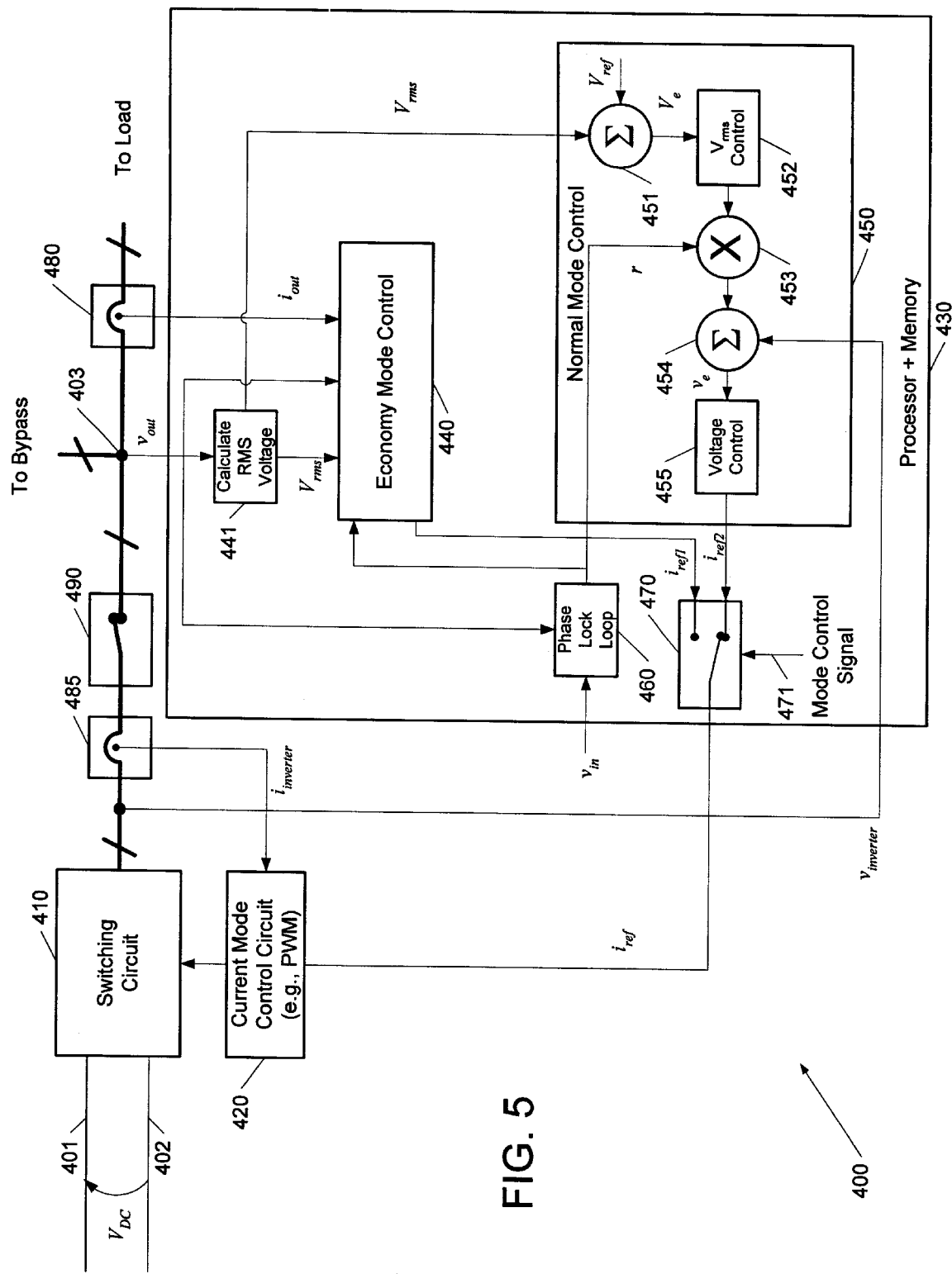

Referring to FIG. 5, in the normal mode, a reference current signal $i_{ref2}$ generated by the normal mode control circuit 450 responsive to the output voltage signal $v_{out}$ is selected for application to the current mode control circuit 420. The normal mode control module 450 includes a first summing module 451 that subtracts the computed RMS voltage $V_{rms}$ from a reference voltage signal $V_{ref}$ which may be provided by any of a variety of control circuits. The resulting rms voltage error signal $V_e$ is then processed by an RMS voltage control module 452 and multiplied by the reference signal r in a multiplier module 453, and the resulting signal is subtracted from a sensed inverter output voltage $v_{inverter}$ in a summing module 454 to produce an error voltage signal $v_e$. The error voltage signal $v_e$ is processed by a voltage control module 455 to generate the second reference current signal $i_{ref2}$.

Preferably, the processing operations described with reference to FIGS. 4 and 5 are partitioned between a microcontroller, such as a Siemens ST10167, and a DSP, such as a DSP from Texas Instruments TMS320XX family of DSP chips. More preferably, computationally intensive operations, such as RMS voltage calculations and power calculations, are performed by the DSP chip, while other functions, such as the phase lock loop and the selector 470, are performed by the microcontroller. However, it will be appreciated that other digital signal processing architectures may be used with the present invention. It will also be appreciated that many of the digital signal processing functions may be implemented using corresponding analog signal processing architectures.

It will be appreciated that, although FIGS. 3–5 and the accompanying description refer to a three-phase UPS application, the invention is applicable to other AC power applications. In general, it will be appreciated that the invention is applicable to single and polyphase systems, and to AC power applications other than UPSs.

Figure 6:
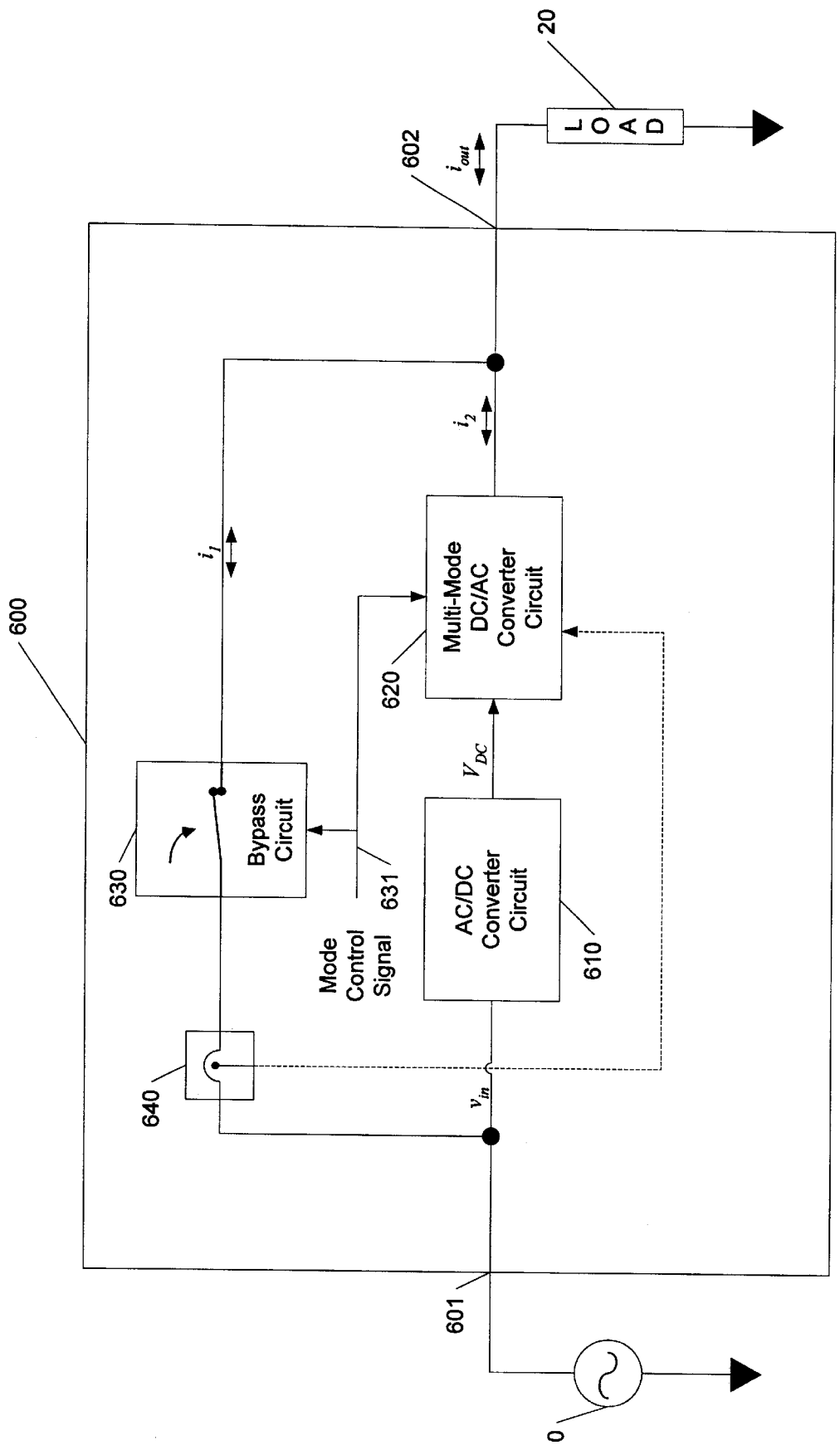
FIG. 6 is a schematic diagram illustrating alternative control configurations according to embodiments of the invention.

The invention also is not limited to the control architectures illustrated in FIGS. 2–5. As illustrated in FIG. 6, a power supply apparatus 600 includes an AC/DC converter circuit 610 that produces a DC voltage $V_{DC}$ from an AC input voltage $v_{in}$ at an AC input port 601, and a bypass circuit 630 that couples and decouples the AC input port to and from an output port 602 responsive to a mode control signal 631. The power supply apparatus 600 also includes a multi-mode DC/AC converter circuit 620 that controls a current flowing between the AC/DC converter circuit 610 and the output port 602 such that, when the bypass circuit 630 is closed, respective first and second current components $i_2$, $i_1$ of an output current $i_{out}$ delivered to a load 20 are carried by respective ones of the bypass circuit 630 and the multi-mode DC/AC converter circuit 620. Here, however, the current $i_2$ may be controlled responsive to the current $i_1$ passing through the bypass circuit 630 and sensed by a current sensor 640. For example, the multi-mode DC/AC converter circuit 620 may compare the sensed current $i_1$ to an ideal current waveform (e.g., a sinusoidal current waveform in phase with the AC input voltage $v_{in}$), and generate a current reference signal based on this comparison that may be used by a current mode control circuit (not shown) within the multi-mode DC/AC converter circuit 620 to control the current $i_2$. It will be appreciated that, in general, a variety of different state variables associated with the power supply apparatus may be used to generate a control input that produces a desired waveform for the current $i_2$.

Figure 7:
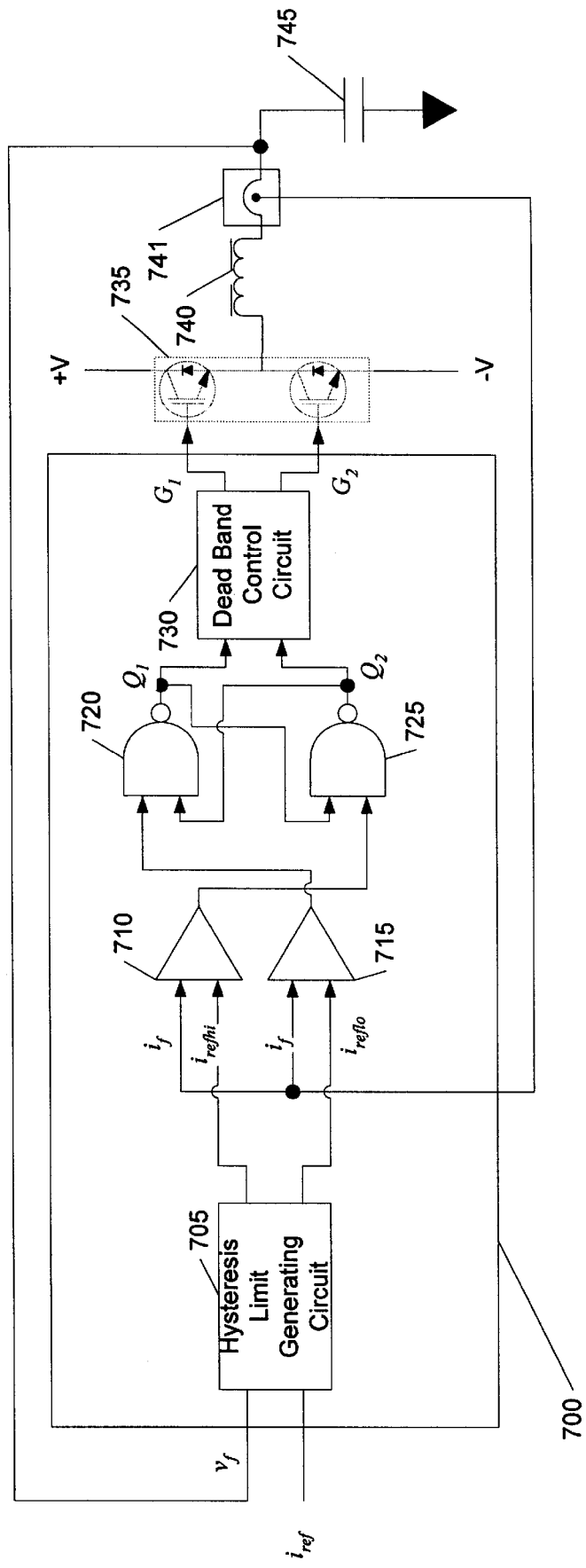
FIG. 7 is a schematic diagram illustrating a current mode controlled inverter circuit according to embodiments of the invention.

FIG. 7 illustrates an exemplary current mode control circuit according to embodiments of the invention, in particular, a hysteretic current control circuit 700 that can provide high-bandwith and favorable switching frequency characteristics. The control circuit 700 controls the operation of an inverter transistor pair 735 that is connected between positive and negative voltage busses +V, -V and has an output connected to an RC output filter including an inductor 740 and a capacitor 745. The control circuit 700 includes a hysteresis limit generating circuit 705 that generates first and second hysteresis limit signals $i_{refhi}$, $i_{reflo}$ responsive to a reference current signal $i_{ref}$ and a filtered output voltage $v_f$ produced by the RC output filter circuit. Preferably, the limit signals $i_{refhi}$, $i_{reflo}$ are generated such that they track the input reference current $i_{ref}$ and are separated by a voltage that varies based on the filtered output voltage $v_f$.

A current feedback signal if from a current sensor 741 is compared to the limit signals $i_{refhi}$, $i_{reflo}$ by first and second comparators 710, 715. Respective output signals produced by the comparators 710, 715 are fed to respective ones of a pair of cross-coupled NAND gates 720, 725 that act as a set-reset (SR) flip-flop. Complementary output signals $Q_1$, $Q_2$ produced by the NAND gates 720, 725 are provided to a dead-band control circuit 730 that conditions the NAND gate output signals such that corresponding respective gate signals $G_1$, $G_2$ applied to the transistors of the inverter transistor pair 735 operate the transistors in a break-before-make fashion. With respect to the generation of the upper and lower hysteresis limit signals $i_{refhi}$, $i_{reflo}$, the following relationship has been found to produce desirable performance:

$$H = \frac{\left[1 - \left(2 * \frac{v_f}{v_{in}}\right)^2\right]}{\left[\frac{4 * L}{V_{in} * f}\right]},$$

where H represents a difference between the reference current signal $i_{ref}$ and each of the upper and lower hysteresis limit signals $i_{refhi}$, $i_{reflo}$, $V_{in}$ is the DC voltage applied across the transistor pair 735, $v_f$ is an instantaneous value of the feedback voltage, L is the inductance of the inductor 740, and $f$ is a desired switching frequency for the transistors 735.

With appropriate control of circuit parameters and other factors, the hysteretic current mode control circuit 700 can constraint the actual frequency at which the transistors 735 operate to be substantially near the desired frequency $f$. This is a potential advantage of the hysteretic current mode control circuit 700 with respect to many conventional hysteretic current mode control circuits, which may not provide such frequency control. Preferably, the hysteretic current mode control circuit 700 is operated such that the transistors 700 switch at a frequency that varies over a range, spreading the energy of interference generated by the switching across a range of frequencies and thus potentially aiding compliance with regulatory requirements. Although FIG. 7 illustrates current control for a transistor pair configuration, the hysteretic current mode control technique illustrated in FIG. 7 is also applicable to single-ended transistor configurations. It will also be appreciated that a wide variety of other control circuits may be used with the invention, including, for example, average current mode control circuits using fixed frequency pulse-width modulation (PWM) techniques, as well as non-current mode control circuits that may be operated such that they provide control of current transfer through a DC/AC converter (e.g., inverter) circuit.

Figure 8:
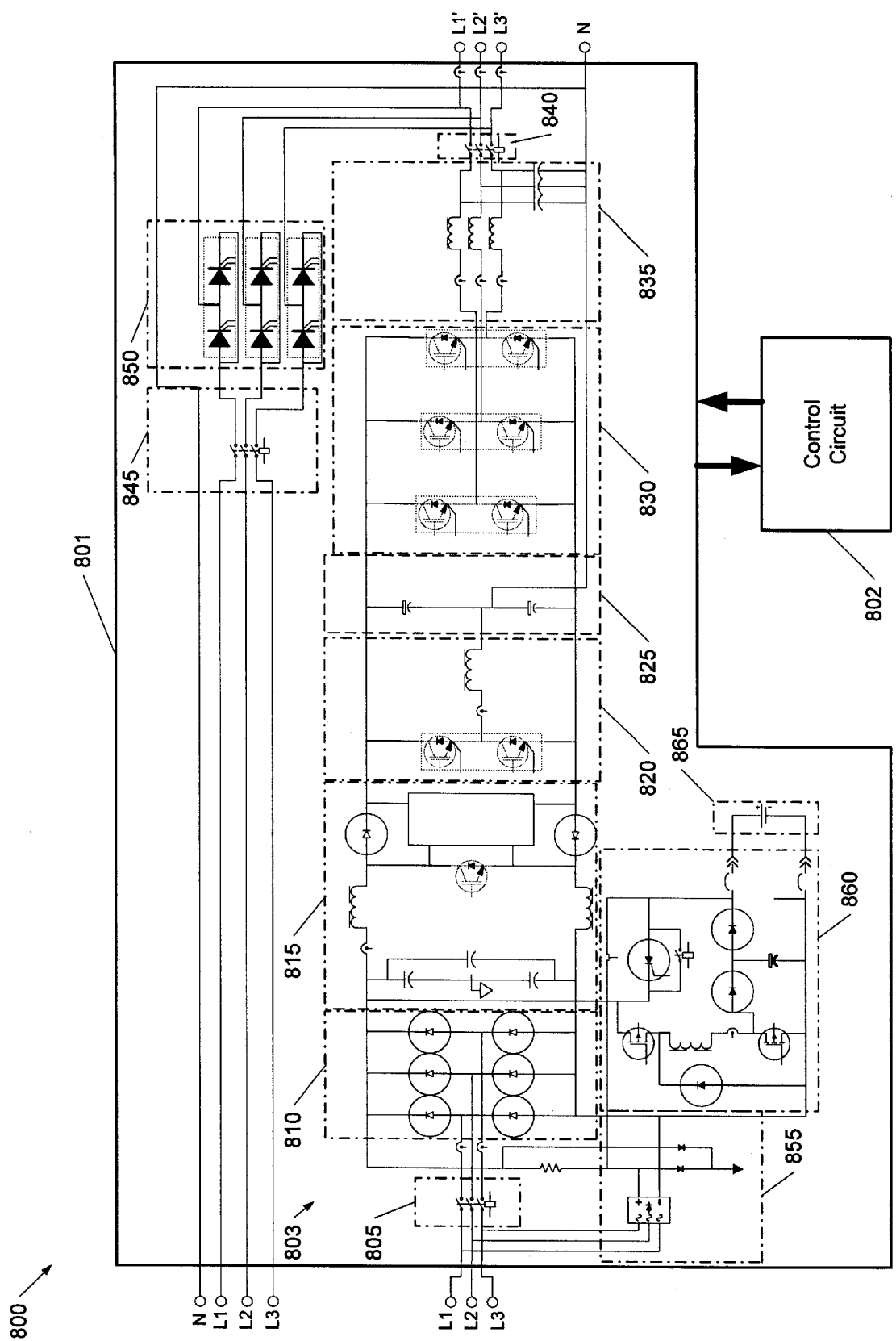
FIG. 8 is a schematic diagram illustrating an uninterruptible power supply according to embodiments of the invention.

FIG. 8 illustrates an exemplary UPS 800 according to an embodiment of the invention. The UPS includes a power supply circuit 801 that produces a three-phase AC output at terminals L1', L2', L3' from an AC input provided at terminals L1, L2, L3, N or a DC input provided by a battery 865. The power supply circuit 801 is monitored and controlled by a control circuit 802. The power supply circuit 801 includes a series train AC/AC conversion circuit 803 connected to the input terminals L1, L2, L3 by a contactor 805. The series train AC/AC converter circuit 803 includes a passive three-phase rectifier circuit 810, a boost regulator circuit 815 and a three-phase inverter circuit 830. The rectifier circuit 810 produces a DC output voltage that is supplied to the boost regulator circuit 815, which provides a boosted and regulated DC output voltage to the inverter circuit 830. Also included in the power supply circuit 801 is a neutral regulator circuit 820 that balances the DC voltage produced by the boost regulator circuit 815 around the voltage of the neutral terminal N, and a DC filter circuit 825. The output of the inverter 830 is filtered by an output filter 835, which is switchably coupled to the output terminals L1', L2', L3' by a second contactor 840. The power supply circuit 801 also includes a bypass circuit including a third contactor 845 that couples a three-phase SCR bypass circuit 850 to the input terminals L1, L2, L3. The output of the SCR bypass circuit 850 is coupled to the output terminals L1', L2', L3'. The power supply circuit 801 further includes a start-up circuit 855, and a battery charger/coupling, circuit 860 that couples the battery 865 to the output of the rectifier circuit 810.

The control circuit 802 is operative to monitor various voltages and currents within the power supply circuit 801, and to responsively generate appropriate signals for controlling the boost regulator circuit 815, the neutral regulator circuit 820, the inverter circuit 830, the SCR circuit 850, the battery charger/coupling circuit 860 and the contactors 805, 840, 845. In particular, the control circuit 802 is operative to monitor and control these components of the power supply circuit 801 along the lines described above to provide a normal series train mode of operation and an economy mode of operation in which the inverter circuit 830 and the SCR bypass circuit 850 both provide power to the output terminals L1', L2', L3'.

It will be appreciated that the UPS 800 may provide superior functionality in comparison to conventional online UPSs, including those with a conventional bypass capability.

The UPS 800 may be operated in an economy mode, as described herein, wherein the inverter circuit 830 is operated as a tracking line filter, generally providing only reactive and harmonic currents at the output terminals L1', L2', L3' while real power is transferred to the output terminals L1', L2', L3' via the SCR bypass circuit 850. The decision as to whether to operate in this economy mode or in a normal series train mode can be conditioned upon power quality at the input terminals L1, L2, L3, as well as on other factors, such as the degree of security desired by the operator of the UPS 800. For example, for periods in which the load served by the UPS 800 is less critical, e.g., during nights or weekends, the operator may choose to exercise the economy mode to realize power savings while accepting an added degree of risk. During periods in which the load is more critical, the operator may choose to disable the economy mode such that the UPS 800 is operating at its highest level of security. Other criteria may also be utilized, such as adaptive criteria that condition use of economy mode based on the conditions experienced by the UPS 800. For example, the UPS 800 may monitor the AC power applied to the input terminals L1, L2, L3, looking for patterns that suggest an increased likelihood of power quality degradation, and may base its decision as to whether to employ the economy mode on this analysis.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A power supply apparatus, comprising:
   an AC input port;
   an output port;
   a bypass circuit coupling the AC input port to the output port;
   an AC/DC converter circuit, coupled to the AC input port, that produces a DC voltage from an AC input voltage at the AC input port; and
   a DC/AC converter circuit, coupled to the AC/DC converter circuit, that controls current transfer between the output port and the AC/DC converter circuit responsive to a control input such that respective first and second component currents of a current delivered to a load coupled to the output port pass via respective ones of the bypass circuit and the DC/AC converter circuit.

2. An apparatus according to claim 1, wherein the DC/AC converter determines a desired current for the second component current and transfers current between the output port and the AC/DC converter circuit based on the determined desired current.

3. An apparatus according to claim 2, wherein the DC/AC converter circuit determines the desired current responsive to a current delivered to the load.

4. An apparatus according to claim 3, wherein the DC/AC converter circuit determines the desired current responsive to an output voltage at the output port and to an output current passing between the output port and the load.

5. An apparatus according to claim 3, wherein the DC/AC converter circuit determines the desired current responsive to the AC input voltage at the AC input port, to an output voltage at the output port and to an output current passing between the output port and the load.

6. An apparatus according to claim 1, wherein the first component current comprises a component of current substantially in phase with the AC input voltage.

7. An apparatus according to claim 6, wherein the second component current comprises at least one of a component of the current delivered to the load having a frequency other than a fundamental frequency of the AC input voltage and a component of the current delivered to the load out of phase with the AC input voltage.

8. An apparatus according to claim 1, wherein the DC/AC converter circuit constrains current passing through the bypass circuit to be substantially in phase with the AC input voltage.

9. An apparatus according to claim 2, wherein the DC/AC converter circuit comprises:
   a switching circuit that selectively couples and decouples the output port to and from the AC/DC converter circuit responsive to a control signal; and
   a controller that generates the control signal responsive to the determined desired current and to a current passing between the output port and the switching circuit.

10. An apparatus according to claim 2, wherein the DC/AC converter circuit comprises a current mode controlled inverter that variably passes current between the output port and the AC/DC converter circuit responsive to the determined desired current.

11. An apparatus according to claim 2, wherein the DC/AC converter circuit comprises as a tracking line filter.

12. An apparatus according to claim 1, wherein the AC/DC converter circuit comprises a rectifier circuit.

13. An apparatus according to claim 1, wherein the AC/DC converter circuit comprises:
   a rectifier circuit, coupled to the AC input port, that produces a rectified DC voltage at a rectifier circuit output from the AC input voltage at the AC input port; and
   a booster circuit, coupled to the rectifier circuit output, that produces a regulated DC voltage from the rectified DC voltage.

14. An apparatus according to claim 13, further comprising a neutral regulator circuit coupled to the AC/DC converter circuit.

15. An apparatus according to claim 13, further comprising a DC filter circuit coupled to the AC/DC converter circuit.

16. A power supply apparatus, comprising:
   an AC input port;
   first and second voltage busses;
   an output port;
   an AC/DC converter circuit, coupled to the AC output port and to the first and second voltage busses, that produces a DC voltage across the first and second voltage busses from an AC input voltage at the AC input port;
   a first switching circuit that selectively couples the AC input port and the output port responsive to a first control input;
   a second switching circuit that selectively couples the output port and the first and second voltage busses responsive to a second control input; and
   a control circuit that generates the first and second control inputs such that, in a first mode of operation, the first switching circuit decouples the AC input port from the output port while the second switching circuit supplies power to the output port and such that, in a second mode of operation, the first switching circuit couples the AC input port to the output port and supplies a first component of a power at the output port while the second switching circuit supplies a second component of the power at the output port.

17. An apparatus according to claim 16, wherein the control circuit determines a current that supports a power demand at the output port and generates the second control input based on the determined current.

18. An apparatus according to claim 17, wherein the control circuit determines the current that supports the power demand at the output port responsive to a current delivered to the load.

19. An apparatus according to claim 18, wherein the control circuit determines the current that supports the power demand at the output port responsive to an output voltage at the output port and to an output current passing between the output port and the load.

20. An apparatus according to claim 18, wherein the control circuit determines the current that supports the power demand at the output port responsive to the AC input voltage at the AC input port, to an output voltage at the output port and to an output current passing between the output port and the load.

21. An apparatus according to claim 16, wherein the control circuit, in the second mode of operation, generates the second control input such that the current passing through the first switching circuit is substantially in phase with the AC input voltage.

22. An apparatus according to claim 16, wherein the control circuit, in the second mode of operation, generates the second control input such that the second switching circuit carries a current that is at least one of a current having a frequency other than the frequency of the AC input voltage and a current out of phase with the AC input voltage.

23. An apparatus according to claim 16, wherein the control circuit operates the second switching circuit as a current mode controlled inverter.

24. An apparatus according to claim 16, further comprising an auxiliary DC power supply circuit that produces a DC voltage across the first and second voltage busses.

25. An uninterruptible power supply apparatus, comprising:
an AC input port;
an AC output port;
a bypass circuit that couples and decouples the AC input port to and from the AC output port responsive to a first control input; and
a series train AC/AC conversion circuit, coupled to the AC input port and to the AC output port, that transfers power between the AC input port and the AC output port such that, in a first mode of operation, the series train AC/AC conversion circuit transfers a first component of power from the AC input port to the AC output port while the bypass circuit transfers a second component of power from the AC input port to the AC output port and such that, in a second mode of operation, the series train AC/AC conversion circuit transfers power from the AC input port to the AC output port while the bypass circuit decouples the AC input port from the AC output port.

26. An apparatus according to claim 25, wherein the series train AC/AC conversion circuit, in the first mode of operation, causes the bypass circuit to predominantly transfer real power from the AC input port to the AC output port.

27. An apparatus according to claim 25, wherein the series train AC/AC conversion circuit comprises:
an AC/DC converter circuit, coupled to the AC input port, that produces a DC voltage from an AC voltage at the AC input port; and
a DC/AC converter circuit, coupled to the AC/DC converter circuit, that controls current transfer between the AC/DC converter circuit and the AC output port.

28. An apparatus according to claim 27, wherein the DC/AC converter circuit controls current transfer between the AC/DC converter circuit and the AC output port responsive to a current passing between the AC output port and a load coupled to the AC output port.

29. An apparatus according to claim 25, wherein the series train AC/AC conversion circuit further comprising a DC input port and is operative to produce an AC voltage at the AC output port from a DC power source coupled to the DC input port.

30. An uninterruptible power supply apparatus, comprising:
an AC input port;
an AC output port;
a bypass circuit that couples and decouples the AC input port to and from the AC output port responsive to a first control input;
a rectifier circuit, coupled to the AC input port, that produces a DC voltage at a rectifier circuit output from an AC input voltage at the AC input port; and
an inverter circuit, coupled to the rectifier circuit output and to the AC output port, that transfers power between the rectifier circuit and the AC output port such that, in a first mode of operation, the inverter circuit transfers a first component of power to the AC output port while the bypass circuit transfers a second component of power to the AC output port and such that, in a second mode of operation, the inverter circuit transfers power to the AC output port while the bypass circuit decouples the AC input port from the AC output port.

31. An apparatus according to claim 30, wherein the inverter circuit, in the first mode of operation, causes the bypass circuit to predominantly transfer real power from the AC input port to the AC output port.

32. An apparatus according to claim 30, wherein the inverter circuit, in the first mode of operation, controls current transfer between the rectifier circuit and the AC output port responsive to a current passing between the AC output port and a load coupled to the AC output port.

33. An apparatus according to claim 30, wherein the inverter circuit comprises a current mode controlled inverter circuit that controls current transfer between the rectifier circuit and the AC output node responsive to a reference current.

34. An apparatus according to claim 33, wherein the inverter circuit comprises a control circuit that generates the reference current.

35. An apparatus according to claim 34, wherein the control circuit generates the reference current responsive to at least one of an AC output voltage at the AC output port, the AC input voltage, a current passing between the AC output port and a load coupled to the AC output port, a bypass current passing through the bypass circuit, and a current passing between the AC input port and an AC power source coupled to the AC input port.

36. An apparatus according to claim 30, further comprising an auxiliary DC power source coupled to the inverter circuit.

37. A method of producing AC power at a load, the method comprising:
coupling an AC power source to the load through a bypass path;
coupling the AC power source to an intermediate bus such that a DC voltage is generated at the intermediate bus; and
controlling current transfer between the intermediate bus and the load such that respective first and second component currents of a current delivered to the load pass via respective ones of the bypass path and the intermediate bus.

38. A method according to claim 37, wherein controlling current transfer between the intermediate bus and the load such that respective first and second component currents of a current delivered to the load pass via respective ones of the bypass path and the intermediate bus comprise controlling current transfer between the intermediate bus and the load such that predominantly real power is delivered to the load via the bypass path.

39. A method according to claim 38, wherein controlling current transfer between the intermediate bus and the load such that respective first and second component currents of a current delivered to the load pass via respective ones of the bypass path and the intermediate bus comprises controlling current transfer between the intermediate bus and the load such that predominantly non-real power components are delivered to the load via the intermediate bus.

40. A method according to claim 39, further comprising determining a current that supports a power demand at the output port, and wherein controlling current transfer between the intermediate bus and the load such that respective first and second component currents of a current delivered to the load pass via respective ones of the bypass path and the intermediate bus comprises controlling current transfer between the intermediate bus and the load based on the determined current.

41. A method according to claim 40, further comprising sensing a current delivered to the load, and wherein determining a current that supports a power demand at the output port comprises determining the current that supports the power demand at the output port responsive to the sensed current.

42. A method according to claim 40, further comprising sensing an output voltage at the load, and sensing an output current passing through the load, and wherein determining a current that supports a power demand at the output port comprises determining the current that supports the power demand responsive to the sensed output current and the sensed output voltage.

43. A method according to claim 40, further comprising sensing an AC input voltage produced by the AC power source, sensing an output voltage at the load, and sensing an output current passing through the load, and wherein determining a current that supports a power demand at the output port comprises determining the current that supports the power demand at the output port responsive to the sensed AC input voltage, the sensed output current and the sensed output voltage.

44. A method according to claim 37, wherein controlling current transfer between the intermediate bus and the load such that respective first and second component currents of a current delivered to the load pass via respective ones of the bypass path and the intermediate bus comprises controlling current transfer between the intermediate bus and the load such that current passing through the bypass path is substantially in phase with an AC input voltage produced by the AC power source.

45. A method according to claim 37, wherein controlling current transfer between the intermediate bus and the load such that respective first and second component currents of a current delivered to the load pass via respective ones of the bypass path and the intermediate bus comprises controlling current transfer between the intermediate bus and the load such that a current passing between the intermediate bus and the load has a frequency other than the frequency of an AC input voltage of the AC power source and/or is out of phase with the AC input voltage.

* * * * *